(12) United States Patent
Wu et al.

(10) Patent No.: US 12,238,959 B2
(45) Date of Patent: Feb. 25, 2025

(54) ROLLABLE DISPLAY DEVICE

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 43 days.

(21) Appl. No.: 17/732,533

(22) Filed: Apr. 29, 2022

(65) Prior Publication Data

US 2022/0384762 A1 Dec. 1, 2022

(30) Foreign Application Priority Data

Jun. 1, 2021 (CN) .......................... 202110610139.8

(51) Int. Cl.
| | | |
|---|---|---|
| *B32B 23/08* | (2006.01) | |
| *B32B 7/12* | (2006.01) | |
| *B32B 27/08* | (2006.01) | |
| *B32B 27/28* | (2006.01) | |
| *B32B 27/30* | (2006.01) | |

(Continued)

(52) U.S. Cl.
CPC .............. *H10K 50/844* (2023.02); *B32B 7/12* (2013.01); *B32B 23/08* (2013.01); *B32B 27/08* (2013.01); *B32B 27/281* (2013.01); *B32B 27/306* (2013.01); *B32B 27/308* (2013.01); *B32B 27/325* (2013.01); *B32B 27/36* (2013.01); *G09F 9/301* (2013.01); *H01L 25/167* (2013.01); *H10K 50/86* (2023.02); *B32B 2270/00* (2013.01); *B32B 2307/202* (2013.01); *B32B 2307/40* (2013.01); *B32B 2307/412* (2013.01); *B32B 2307/42* (2013.01); *B32B 2307/546* (2013.01); *B32B 2457/206* (2013.01); *B32B 2457/208* (2013.01); *G02B 5/3083* (2013.01);

(Continued)

(58) Field of Classification Search
CPC ......... B32B 7/12; B32B 23/08; B32B 27/281; B32B 27/306; B32B 27/325; B32B 27/36; B32B 2307/40; B32B 2307/412; B32B 2307/42; B32B 2307/546; B32B 2457/206; B32B 2457/208; B32B 2270/00; H10K 50/86; H10K 50/844; H10K 59/122; G09F 9/301
See application file for complete search history.

(56) References Cited

U.S. PATENT DOCUMENTS 10,783,808 B2 * 9/2020 Cho .................. G02F 1/133528
11,127,928 B2    9/2021 Lee (Continued)

FOREIGN PATENT DOCUMENTS

CN    107978621 A       5/2018
KR   1020190036935 A *  4/2019

*Primary Examiner* — Catherine A. Simone
(74) *Attorney, Agent, or Firm* — Winston Hsu

(57) ABSTRACT

A rollable display device having a normal display status and an expanded display status is disclosed. The rollable display device includes a display layer and an optical layer. The display layer has a greater display area when the rollable display device is in the expanded display status than in the normal display status. The optical layer is attached to the display layer through an adhesive, and the optical layer includes a base layer and a functional layer disposed between the base layer and the adhesive. The functional layer is in contact with the adhesive.

11 Claims, 7 Drawing Sheets

(51) Int. Cl.
  *B32B 27/32* (2006.01)
  *B32B 27/36* (2006.01)
  *G02B 5/30* (2006.01)
  *G09F 9/30* (2006.01)
  *H01L 25/16* (2023.01)
  *H10K 50/844* (2023.01)
  *H10K 50/86* (2023.01)
  *H10K 59/122* (2023.01)
  *H10K 77/10* (2023.01)
  *H10K 102/00* (2023.01)

(52) U.S. Cl.
  CPC .......... *H10K 59/122* (2023.02); *H10K 77/111* (2023.02); *H10K 2102/311* (2023.02); *H10K 2102/351* (2023.02)

(56) References Cited

U.S. PATENT DOCUMENTS

| | | | |
|---|---|---|---|
| 2018/0114950 A1* | 4/2018 | Lee | B32B 15/20 |
| 2020/0161589 A1* | 5/2020 | Konishi | G09F 9/30 |
| 2020/0313112 A1 | 10/2020 | Lee | |
| 2021/0132275 A1 | 5/2021 | Beon | |
| 2021/0265578 A1* | 8/2021 | Lee | B32B 15/09 |

* cited by examiner

ROLLABLE DISPLAY DEVICE

BACKGROUND OF THE DISCLOSURE

1. Field of the Disclosure

The present disclosure relates to a rollable display device, and more particularly to a rollable display device with an optical layer.

2. Description of the Prior Art

In recent years, rollable display devices or deformable display devices have become one of the focuses of the new generation of electronic technology. Generally, the area of the display area of a rollable display device or a deformable display device can be changed by being rolled-up, but the stress generated during the expanding and/or folding of its structure may affect the display performance or cause the display device to be damaged, so the manufacturers need to develop suitable designs of the structure to reduce the problems caused by the stress.

SUMMARY OF THE DISCLOSURE

An embodiment of the present disclosure provides a rollable display device having a normal display status and an expanded display status, and the rollable display device includes a display layer and an optical layer. The display layer has a greater display area when the rollable display device is in the expanded display status than in the normal display status. The optical layer is attached to the display layer through an adhesive, and the optical layer includes a base layer and a functional layer disposed between the base layer and the adhesive. The functional layer is in contact with the adhesive.

These and other objectives of the present disclosure will no doubt become obvious to those of ordinary skill in the art after reading the following detailed description of the embodiment that is illustrated in the various figures and drawings.

DETAILED DESCRIPTION

Figure 1:
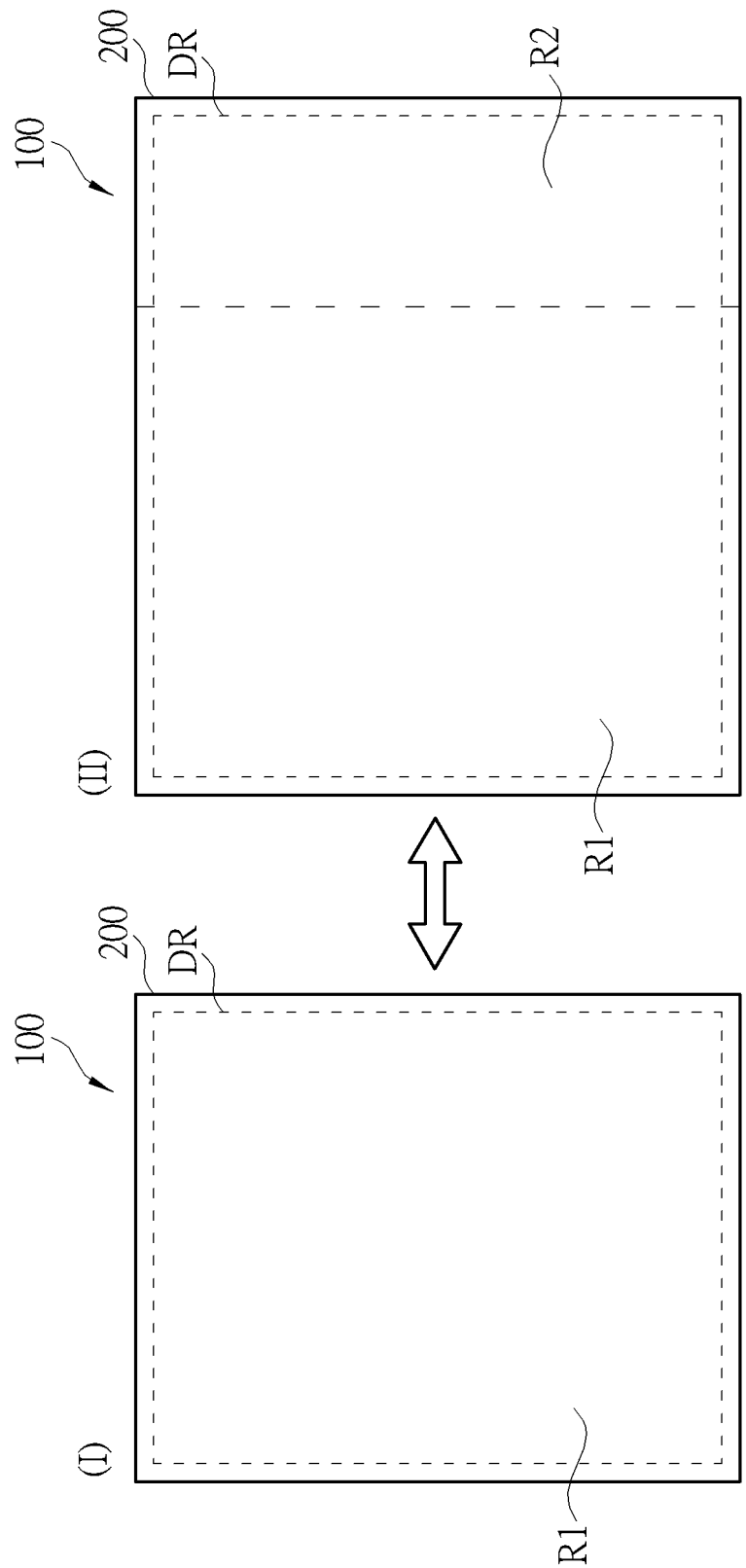
FIG. 1 is a top-view schematic diagram of a rollable display device in different statuses according to an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device or the structure, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations and/or components.

The directional terms mentioned in this document, such as "up", "down", "front", "back", "left", "right", etc., are only directions referring to the drawings. Therefore, the directional terms used are for illustration, not for limitation of the present disclosure. In the drawings, each drawing shows the general characteristics of methods, structures and/or materials used in specific embodiments. However, these drawings should not be interpreted as defining or limiting the scope or nature covered by these embodiments. For example, the relative size, thickness and position of each layer, area and/or structure may be reduced or enlarged for clarity.

When a corresponding constituent element (e.g., a layer or an area) is referred to as being "on" another constituent element, it may be directly on the other constituent element, or intervening constituent elements may be presented. In contrast, when a constituent element is referred to as being "directly on" another constituent element, there are no intervening constituent elements presented. In addition, when a constituent element is referred to as being "on" another constituent element, there is an upper and lower relationship between the two constituent elements in the top-view direction, and this constituent element may be above or below the other constituent element, while this up and down relationship depends on the orientation of the device.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In the present disclosure, the length and the width may be measured by an optical microscope, and the thickness may be measured by a cross-sectional image of an electron microscope, but not limited herein. In addition, some errors or inaccuracy may exist between any two values or directions used for comparison. If a first value is equal to a second value, it implies that there may be about 10% error between the first value and the second value. If a first direction is perpendicular to a second direction, the angle between the first direction and the second direction may range from 80 degrees to 100 degrees. If a first direction is parallel to a second direction, the angle between the first direction and the second direction may range from 0 degrees to 10 degrees.

Unless defined additionally, all terms (including technical and scientific terms) used herein have the same meaning as commonly understood by one skilled in the art. It can be understood that these terms, such as terms defined in commonly used dictionaries, should be interpreted as having meanings consistent with related technologies and the background or context of the present disclosure, and should not be interpreted in an idealized or excessively formal way, unless specifically defined in the embodiments of the present disclosure.

Figure 2:
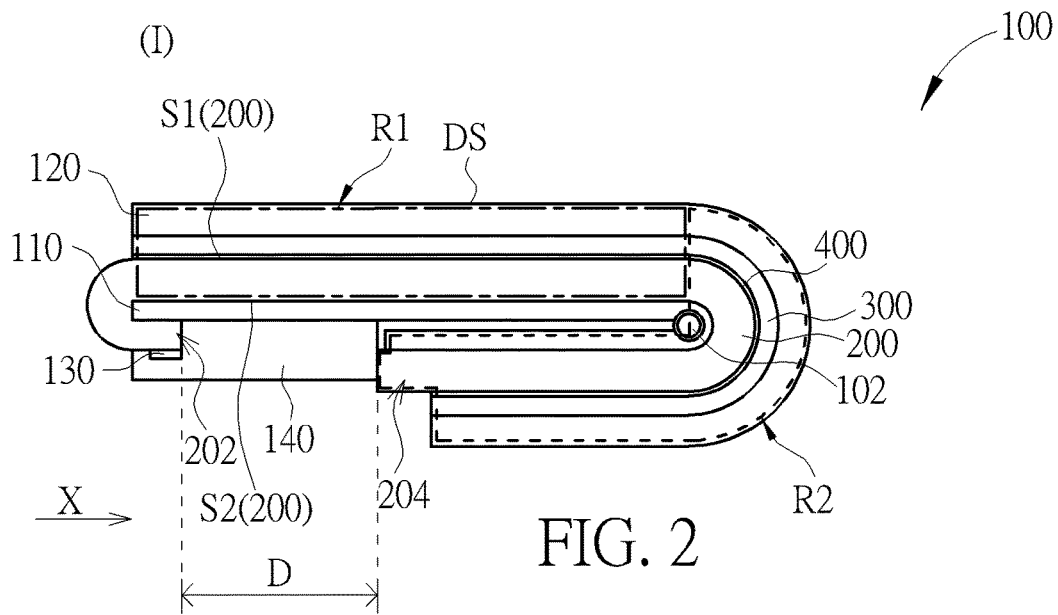
FIG. 2 is a cross-sectional view schematic diagram of a rollable display device in a normal display status according to an embodiment of the present disclosure.
Figure 3:
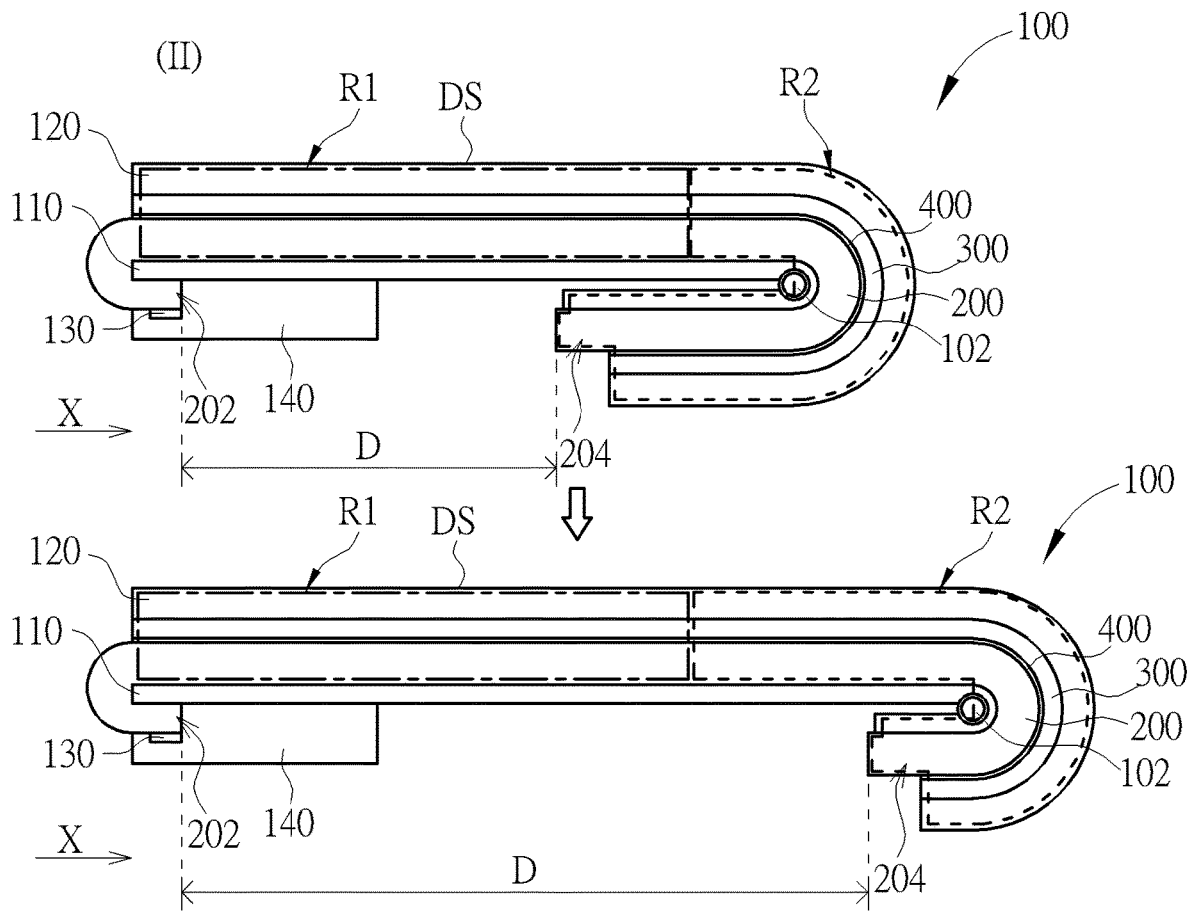
FIG. 3 is a cross-sectional view schematic diagram of a rollable display device in an expanded display status according to an embodiment of the present disclosure.

Please refer to FIG. 1, FIG. 2 and FIG. 3. FIG. 1 is a top-view schematic diagram of a rollable display device in different statuses according to an embodiment of the present disclosure. FIG. 2 is a cross-sectional view schematic diagram of a rollable display device in a normal display status according to an embodiment of the present disclosure. FIG. 3 is a cross-sectional view schematic diagram of a rollable display device in an expanded display status according to an embodiment of the present disclosure. As shown in FIG. 1, FIG. 2 and FIG. 3, in the present disclosure, a rollable display device 100 has a normal display status I and an expanded display status II, and the rollable display device 100 includes a display layer 200 and an optical layer 300. In some embodiments, the optical layer 300 may be attached to the display layer 200 through an adhesive 400. The display layer 200 may include display media including, for example, liquid crystal, light emitting diodes (LEDs), quantum dots (QDs), fluorescence or phosphors. The light emitting diodes may include, for example, organic light emitting diodes (OLEDs), mini light emitting diodes (mini LEDs), micro light emitting diodes (micro LEDs) or quantum dot light emitting diodes (quantum dot LEDs, e.g., QDLEDs), but not limited herein.

In some embodiments, the display layer 200 has a display area DR, and the display area DR is an area for displaying images when the rollable display device 100 is in operation. The area of the display area DR may be changed by folding or unfolding the partially rollable display layer 200. For example, the rollable display device 100 may have a non-rollable area R1 and a rollable area R2, and the rollable area R2 is connected to a side of the non-rollable area R1, for example. The area of the non-rollable area R1 when viewed from the top-view direction is fixed and constant, and the rollable area R2 may be folded or unfolded by a rotating element 102 (e.g., a rotating shaft or a roller) or other suitable elements, but not limited herein. In some embodiments, the area of the display area DR may be, for example, changed according to the folding or unfolding of the rollable area R2. In some embodiments, the status while the rollable area R2 of the rollable display device 100 being totally folded is defined as the normal display status I, and the status while the rollable area R2 of the rollable display device 100 being at least partially unfolded is defined as the expanded display status II. That is to say, the expanded display status II includes the status that the rollable area R2 is partially unfolded (as shown in the upper portion of FIG. 3), the status that the rollable area R2 is mostly unfolded (as shown in the lower portion of FIG. 3) and the status that the rollable area R2 is totally unfolded (not shown in the drawings). The display layer 200 may, for example, have a greater display area DR when the rollable display device 100 is in the expanded display status II than in the normal display status I.

It should be noted that, although the non-rollable area R1 is illustrated by the drawings as a flat form, the non-rollable area R1 may be wavy or have an curve edge in other embodiments (not shown), but the area of this non-rollable area R1 when viewed from the top-view direction is still fixed and constant.

It should be noted that, the rollable display device 100 may optionally have a frame/housing (not shown) or a shielding element (not shown), this frame element or shielding element may selectively overlap or cover the rotating element 102 and/or a portion of the display layer 200. Furthermore, the change of the display area DR of the rollable display device 100 in the normal display status I and the expanded display status II illustrated in FIG. 1 may be different according to the condition of the display layer 200 shielded by the frame element or the shielding element described above, but the display layer 200 may still have a greater display area DR when the rollable display device 100 is in the expanded display status II than in the normal display status I.

As shown in FIG. 2 and FIG. 3, in some embodiments, the rollable display device 100 may further include a supporting structure 110, a cover layer 120, a signal pad 130 and/or a circuit board 140 (e.g., a flexible circuit board or a rigid circuit board). In some embodiments, the display layer 200 may be disposed on the supporting structure 110, and the supporting structure 110 may be disposed on and in contact with the back side S2 of the display layer 200, but not limited herein. In some embodiments (not shown), the display layer 200 and the supporting structure 110 may be adhered to each other through a glue layer (not shown). In some embodiments, the optical layer 300 may be attached to the front side S1 of the display layer 200 through the adhesive 400, and the cover layer 120 may be disposed on the optical layer 300. In some embodiments, the material of the adhesive 400 may include UV adhesive, photocurable adhesive, opticallly clear adhesive (OCA), optically clear resin (OCR), thermosetting adhesive, moisture curing adhesive, pressure sensitive adhesive (PSA), other suitable adhesives or any combination of the above, but not limited herein. In some embodiments, the material of the adhesive 400 may include acrylate or other suitable materials, but not limited herein. In some embodiments, the display layer 200 may be disposed between the supporting structure 110 and the optical layer 300. In some embodiments, the optical layer 300 may be disposed between the display layer 200 and the cover layer 120.

In some embodiments, the display layer 200 may have an end portion 202 and an end portion 204 located on opposite two sides. In some embodiments, the end portion 202 may be, for example, connected to and fixed to a portion of the display layer 200 located in the non-rollable area R1. In some embodiments, the end portion 202 may be, for example, bent to the back side S2 of the display layer 200 and fixed to the supporting structure 110. In some embodiments, the end portion 202 may be, for example, fixed to the supporting structure 110 through a glue layer (not shown) but not limited herein. In some embodiments, the end portion 204 may be opposite to the end portion 202, and the end portion 204 is, for example, located in the rollable area R2. In some embodiments, the end portion 204 may be, for example, moved through the rotating element 102 or other suitable elements, so that the rollable area R2 may be folded or unfolded. In some embodiments, the end portion 204 may be, for example, moved to different positions (as shown in the upper portion of FIG. 3 and the lower portion of FIG. 3) according to different status of the expanded display status II. In some embodiments, a distance D between the end portion 204 and the end portion 202 may be changed by moving the end portion 204 through the rotating element 102 or other suitable elements, for example. The distance D may be defined as the minimum distance between the end portion 204 and the end portion 202 in the expanding direction X. In some embodiments, the end portion 202 and/or the end portion 204 may be, for example, located at a side of the supporting structure 110 away from the display surface DS whether in the normal display status I or the extended display status II. In some embodiments, when the display area DR in the rollable area R2 is fully expanded (as shown in the lower portion of FIG. 3), the end portion 204 of the display layer 200 may, for example, still be disposed under the supporting structure 110, so that a portion of the display layer 200 may be rolled-up, and this design may make it easier for the fully expanded rollable area R2 to be folded again.

In some embodiments, the signal pad 130 may be, for example, disposed on the end portion 202, the display layer 200 may be connected to the circuit board 140 through the signal pad 130, and signals may be transmitted through the circuit board 140 to control the driving of the display layer 200, but not limited herein. In some embodiments, as shown in FIG. 2, since the signal pad 130 is disposed on the end portion 202, the signal pad 130 may be electrically connected to the circuit board 140 more stably, but not limited herein. In some embodiments, the circuit board 140 may be, for example, disposed under the supporting structure 110 and selectively fixed to the supporting structure 110. In some embodiments, since the signal pad 130 is disposed on the end portion 202 of the display layer 200 instead of displaying pictures, the optical layer 300, the adhesive 400 and/or the cover layer 120 may be selectively not disposed on the end portion 202 or not cover the end portion 202, but limited herein. In some embodiments, an integrated circuit chip or a control unit may be selectively disposed on the circuit board 140, but not limited herein. In some embodiments (not shown), the circuit board 140 may be selectively removed, and the integrated circuit chip may be, for example, connected to the signal pad 130, but not limited herein. In some embodiments, since the end portion 204 of the display layer 200 may not be used for displaying pictures, the optical layer 300, the adhesive 400 and/or the cover layer 120 may be selectively not disposed on the end portion 204, but not limited herein. In some embodiments, the optical layer 300, the adhesive 400 and/or the cover layer 120 may, for example, selectively cover or not cover the end portion 204, but not limited herein. It should be noted that, the present disclosure is not limited to the designs of the structure of the above embodiments. In some embodiments, the supporting structure 110 may selectively have a plurality of hole structures (not shown), and the hole structures may be, for example, correspondingly located in the rollable area R2 to facilitate the bending of the supporting structure 110, but not limited herein.

Figure 4:
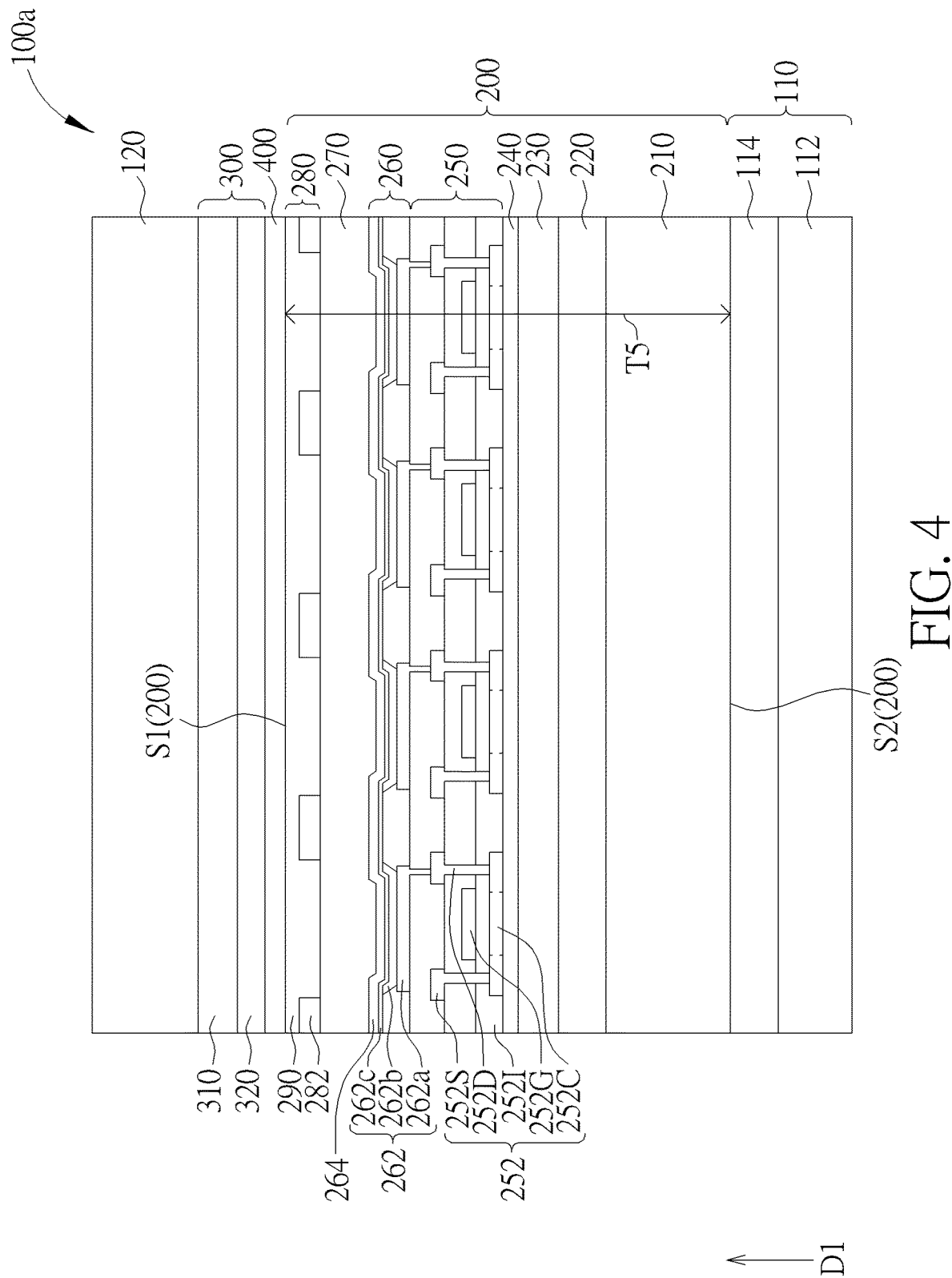
FIG. 4 is a partially enlarged cross-sectional view schematic diagram of a rollable display device according to a first embodiment of the present disclosure.

Please refer to FIG. 4, cooperated with FIG. 1, FIG. 2 and FIG. 3. FIG. 4 is a partially enlarged cross-sectional view schematic diagram of a rollable display device according to a first embodiment of the present disclosure, which illustrates the detailed corresponding relationship of each layer of the rollable display device of the present disclosure. The rollable display device 100a shown in FIG. 4 may be, for example, applied to the rollable display device 100 shown in FIG. 1 to FIG. 3. As shown in FIG. 4, in some embodiments, the rollable display device 100a may include a supporting structure 110, a display layer 200, an adhesive 400, an optical layer 300 and/or a cover layer 120 stacked sequentially along a first direction D1 (e.g., the normal direction of the substrate 230), but not limited herein. In some embodiments, the supporting structure 110 may include a single-layer or multi-layer structure. In some embodiments, the supporting structure 110 may include at least one supporting plate 112 and at least one glue layer 114 (e.g., supporting structure glue), and the supporting plate 112 may be attached to the display layer 200 (such as attached to the back side S2 of the display layer 200) through the glue layer 114. In some embodiments, the thickness of the glue layer 114 may be, for example, 20 micrometers (μall) to 300 micrometers (20 μm≤thickness≤300 μm) or 30 micrometers to 200 micrometers (30 μm≤thickness≤200 μm), such as 20 μm, 30 μm, 40 μm or 80 μm, but not limited herein. In some embodiments, the material of the supporting plate 112 may include metal material (e.g. stainless steel material), heat dissipation material or other suitable materials, but not limited herein. In some embodiments, the supporting plate 112 may be, for example, used as a heat sink, but not limited herein. As described above, a portion of the supporting plate 112 corresponding to the rollable area R2 may, for example, have holes (or a patterned design), so that this portion of the supporting plate 112 has higher flexibility. In some embodiments, the display layer 200 may include, for example, a substrate 210, a glue layer 220, a substrate 230 (e.g., a flexible substrate), an insulating layer 240 (e.g., a buffer layer), a circuit layer 250, a light emitting structure 260, an encapsulation layer 270 and/or a touch layer 280 stacked sequentially along the first direction D1, but not limited herein. Other layers may be selectively intervened between any two layers of the display layer 200 described above, or any layer of the display layer 200 described above may be selectively removed. In some embodiments, the substrate 210 may include polyimide (PI), polyethylene terephthalate (PET), other suitable materials or any combination of the above, but not limited herein. In some embodiments, the substrate 230 may include, for example, polyimide or other suitable materials. In some embodiments, the substrate 210 may be attached to the substrate 230 through the glue layer 220. The thickness of the glue layer 220 may be, for example, 20 micrometers to 300 micrometers (20 µm≤thickness≤300 µm) or 40 micrometers to 200 micrometers (40 µm≤thickness≤200 µm), such as 20 µm, 30 µm, 40 µm or 80 µm, but not limited herein.

In some embodiments, the circuit layer 250 may include a plurality of thin film transistors (TFTs) 252 and/or wires, and the thin film transistors 252 may be used as, for example, switching elements and/or driving elements, but not limited herein. In FIG. 4, the thin film transistor 252 may include a channel layer 252C, a gate 252G, a source 252S, a drain 252D and a gate insulating layer 252I, but not limited herein. The stack of layers of the thin film transistor 252 shown in FIG. 4 is only one of the examples, but not limited herein. In some embodiments, the light emitting structure 260 may include a plurality of light emitting elements 262, and the light emitting elements 262 may include, for example, organic light emitting diode elements or light emitting diode elements. For example, the light emitting element 262 may include a lower electrode 262a, a light emitting layer 262b (e.g., an organic light emitting layer) and an upper electrode 262c. The lower electrode 262a may be, for example, electrically connected to the drain 252D (or the source 252S) of the thin film transistor 252, but not limited herein. In some embodiments, the upper surface of the light emitting element 262 may be selectively provided with an insulating layer 264, and the insulating layer 264 may include an organic insulating layer, an inorganic insulating layer or any combination of the above. In some embodiments, light conversion layers (not shown) may be selectively disposed on different light emitting elements 262, and the light conversion layers may include filter materials, fluorescence, phosphorescence or quantum dots, but not limited herein.

In some embodiments, the encapsulation layer 270 may cover the light emitting structure 260. In some embodiments, the encapsulation layer 270 may be used as a planarization layer or a protective layer. For example, the encapsulation layer 270 may protect the light emitting structure 260 and the circuit layer 250 or reduce the probability that the light emitting structure 260 and the circuit layer 250 are invaded by water and/or oxygen. In some embodiments, the touch layer 280 may be disposed on the encapsulation layer 270, and the light emitting structure 260 may be located between the touch layer 280 and the circuit layer 250, but not limited herein. In some embodiments, the touch layer 280 may include a composite layer. For example, the touch layer 280 may include at least one insulating layer 290 and a plurality of touch elements 282 and/or wires (not shown). The touch elements 282 may include transmission electrodes and/or output electrodes, but not limited herein. The touch element 282 may selectively have a grid structure (e.g. a metal mesh) or other structures. In some embodiments, the pattern of the touch layer 280 is, for example, not overlapped with the light emitting structure 260 in the first direction D1. In some embodiments, the insulating layer 290 may cover the touch elements 282 to reduce the probability that the touch elements 282 are invaded by water and/or oxygen. In some embodiments, the optical layer 300 may include a base layer 310 and a functional layer 320 disposed between the base layer 310 and the adhesive 400. In some embodiments, the functional layer 320 may be in contact with the adhesive 400. Regarding the materials of the base layer 310 and the functional layer 320, please refer to the subsequent detailed illustration of FIG. 6.

In some embodiments, a glue layer 122 (e.g., an optically clear adhesive (OCA)) may be selectively disposed between the optical layer 300 and the cover layer 120 to make the optical layer 300 and the cover layer 120 be adhered to each other. Through the design of the structure described above, an on-cell touch rollable display device 100a shown in FIG. 4 may be constructed, but not limited herein. It should be noted that, the material and the thickness of each layer described above are only examples. The material of each layer in the rollable display device 100a of the present disclosure may include other suitable materials not listed, the appropriate thickness of each layer may be adjusted according to the materials and the designs, and so do the following embodiments, which will not be described redundantly herein.

Figure 5:
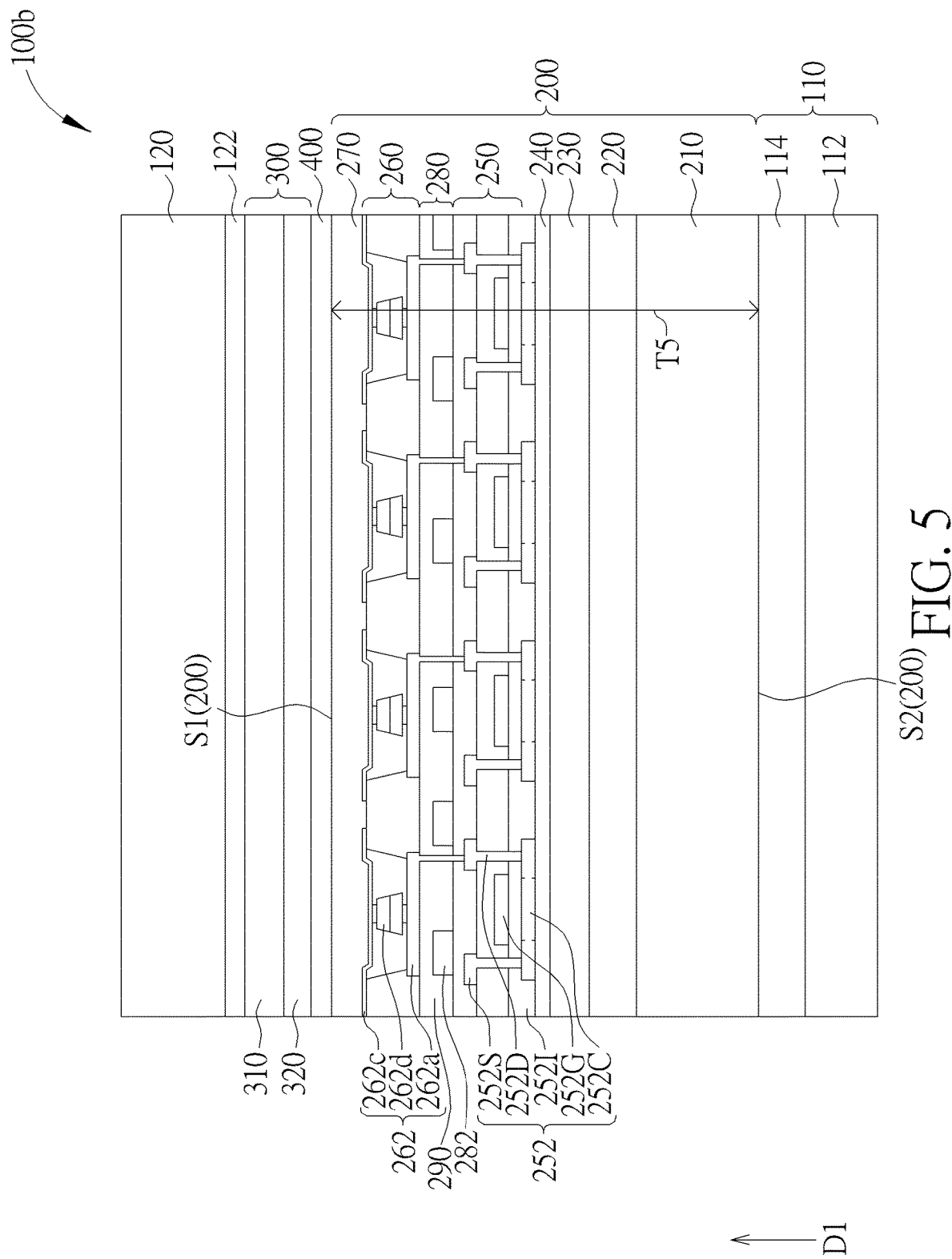
FIG. 5 is a partially enlarged cross-sectional view schematic diagram of a rollable display device according to a second embodiment of the present disclosure.

Please refer to FIG. 5, cooperated with FIG. 1, FIG. 2 and FIG. 3. FIG. 5 is a partially enlarged cross-sectional view schematic diagram of a rollable display device according to a second embodiment of the present disclosure, which illustrates the detailed corresponding relationship of each layer of the rollable display device of the present disclosure. The rollable display device 100b shown in FIG. 5 may be applied to the rollable display device 100 shown in FIG. 1 to FIG. 3. As shown in FIG. 5, the rollable display device 100b may include a supporting structure 110, a display layer 200, an adhesive 400, an optical layer 300, a glue layer 122 and/or a cover layer 120 stacked sequentially along the first direction D1. The supporting structure 110 may include at least one supporting plate 112 and at least one glue layer 114. In some embodiments, the display layer 200 may include a substrate 210, a glue layer 220, a substrate 230, an insulating layer 240, a circuit layer 250, a touch layer 280, a light emitting structure 260 and/or an encapsulation layer 270 stacked sequentially along the first direction D1, but not limited herein. Similarly, the optical layer 300 may include a base layer 310 and a functional layer 320, and the functional layer 320 is disposed between the base layer 310 and the adhesive 400. Different from the previous embodiment, the touch layer 280 of the embodiment shown in FIG. 5 may be, for example, located between the circuit layer 250 and the light emitting structure 260. The light emitting element 262 (e.g., an inorganic light emitting diode) in the light emitting structure 260 may include, for example, a first electrode (not labeled), a first semiconductor layer (not labeled), a light emitting layer 262d (e.g., an inorganic light emitting layer), a second semiconductor layer (not labeled) and a second electrode (not labeled) stacked sequentially along the first direction D1. The first electrode may be, for example, in contact with or electrically connected to the lower electrode 262a, and the second electrode may be, for example, in contact with or electrically connected to the upper electrode 262c, but not limited herein. In some embodiments, the glue layer 122 between the optical layer 300 and the cover layer 120 may be selectively removed. In some embodiments, a portion of the patterns of the touch layer 280 may be, for example, overlapped with the driving element 252 in the first direction D1, but not limited herein. In some embodiments, a portion of the patterns of the touch layer 280 may be, for example, overlapped with a portion of the lower electrode 262a in the first direction D1, but not limited herein. The layers, components, structures and materials included in the rollable display device 100b in this embodiment may be referred to the rollable display device 100a in the previous embodiment, which will not be described redundantly herein. Through the design of the structure described above, an in-cell touch rollable display device 100b shown in FIG. 5 may be constructed.

Figure 6:
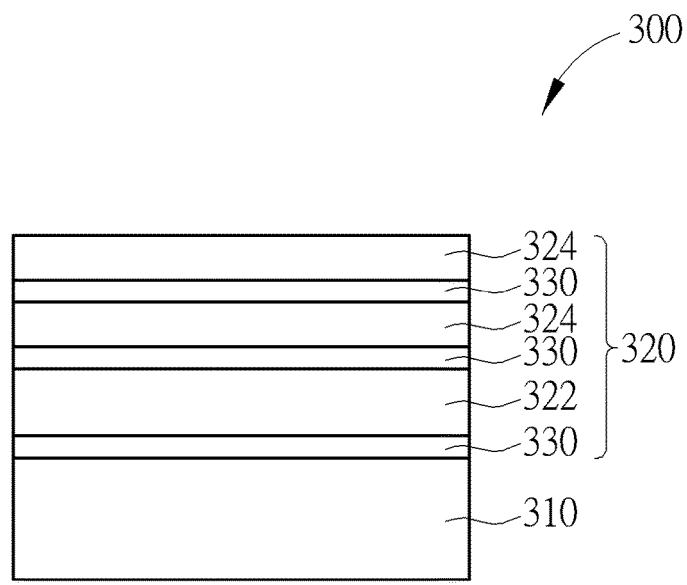
FIG. 6 is a cross-sectional view schematic diagram of an optical layer of a rollable display device according to an embodiment of the present disclosure.

Please refer to FIG. 6. FIG. 6 is a cross-sectional view schematic diagram of an optical layer of a rollable display device according to an embodiment of the present disclosure. As shown in FIG. 6, the optical layer 300 may include a base layer 310 and a functional layer 320. In the rollable display device 100 (or the rollable display device 100a or the rollable display device 100b), the optical layer 300 may be attached to the display layer 200 through an adhesive 400 (as shown in FIG. 2 and FIG. 3), the functional layer 320 may be disposed between the base layer 310 and the adhesive 400, and the functional layer 320 may be attached to base layer 310 through the adhesive 400. In some embodiments, the base layer 310 may include flexible substrate material, which is used to carry the functional layer 320. In some embodiments, the material of the base layer 310 may include, for example, poly(methyl methacrylate) (PMMA), polyethylene terephthalate, tri-acetyl cellulose (TAC), cycle-olefin polymer (COP), poly-vinyl alcohol (PVA), other suitable substrate materials or any combination of the above, but not limited herein. In some embodiments, the functional layer 320 may include, for example, an anti-reflection layer, a polarizing layer, a retardation layer, a filter layer, a light path adjusting layer, other suitable optical layer stacked structures or any combination of the above, but not limited herein.

For example, the functional layer 320 may include a polarizing layer 322 and/or a retardation layer 324. The polarizing layer 322 may be, for example, disposed between the retardation layer 324 and the base layer 310, but not limited herein. In some embodiments, the polarizing layer 322 may include iodine, such as polyvinyl alcohol containing iodine, and the material thereof can provide polarizing effect, but not limited herein. In some embodiments, the retardation layer 324 may include liquid crystal material or other suitable materials, which is used to provide the function of phase retardation, but not limited herein. In some embodiments, the retardation layer 324 may be a quarter-wave retardation layer or a retardation layer with other suitable wavelengths (e.g., a half-wave retardation layer), but not limited herein. In some embodiments, the functional layer 320 may include at least one polarizing layer 322 and at least one retardation layer 324 (as shown in FIG. 6). For example, the functional layer 320 may include a polarizing layer 322 and two retardation layers 324. The two retardation layers 324 may be, for example, a quarter-wave retardation layer and a half-wave retardation layer, respectively, and the half-wave retardation layer may be, for example, disposed between the quarter-wave retardation layer and the polarizing layer 322, but not limited herein. As shown in FIG. 6, the optical layer 300 may include one or plural intermediate layer(s) 330, and the intermediate layer(s) 330 may be selectively disposed between the polarizing layer 322 and the base layer 310, between the retardation layer 324 and the polarizing layer 322, and/or between the retardation layer 324 and the retardation layer 324, respectively. In some embodiments, the intermediate layer 330 may include, for example, ultraviolet curing adhesive (UV adhesive) or other suitable glue layers, and the adhesion between each layer may be improved through the intermediate layer 330, but not limited herein. In some embodiments, the intermediate layer 330 may be selectively partially or completely removed to simplify the stacking of the optical layer 300, so as to make the thickness of the optical layer 300 thinner, but not limited herein.

In some embodiments, the functional layer 320 may be formed on the base layer 310 through multiple coating processes in the manufacturing process of the optical layer 300. In some embodiments, the manufacturing process of the optical layer 300 may include the following steps. First, a base layer 310 is provided. Then, the polarizing layer 322 is coated on the base layer 310. Alternatively, in some embodiments, an intermediate layer 330 may be coated on the base layer 310 first, and then the polarizing layer 322 is coated on the intermediate layer 330, so that the intermediate layer 330 may be used as a connecting medium between the base layer 310 and the polarizing layer 322, but not limited herein. In some embodiments, the material of the polarizing layer 322 may be coated on the base layer 310 by blade coating, and for example, the polarizing layer 322 may be aligned at the same time by the blade coating. After coating, drying may be performed (such as drying at a temperature of 80° C. to 100° C., but not limited herein). Through the method described above, the polarizing layer 322 may be formed on the base layer 310, but not limited herein. In some embodiments, the alignment of the polarizing layer 322 may be accomplished by optical alignment, rubbing, photolithography or other suitable alignment methods, but not limited herein.

After the step of forming the polarizing layer 322, for example, the retardation layer 324 may be coated on the polarizing layer 322. Alternatively, in some embodiments, an intermediate layer 330 may be coated on the polarizing layer 322 first, and then the retardation layer 324 is coated on the intermediate layer 330, so that the intermediate layer 330 may be used as a connecting medium between retardation layer 324 and the polarizing layer 322. In some embodiments, the thickness of the intermediate layer 330 may be, for example, 0.1 micrometers to 4 micrometers (0.1 μm≤thickness≤4 μm) or 0.2 micrometers to 3 micrometers (0.2 μm≤thickness≤3 μm), but not limited herein. In some embodiments, the thickness of the retardation layer 324 may be, for example, 1.5 micrometers to 4 micrometers (1.5 μm≤thickness≤4 μm) or 2 micrometers to 3.5 micrometers (2 μm≤thickness≤3.5 μm), but not limited herein. In some embodiments, the retardation layer 324 may be a quarter-wave retardation layer, and the retardation layer 324 may be designed as corresponding to a single wavelength (e.g., the wavelength of 550 nanometers (nm) or other suitable wavelengths), or the retardation layer 324 may be designed as having a plurality of areas which respectively correspond to different wavelengths of sub-pixels (such as respectively corresponding to red, green and blue wavelengths), but not limited herein. In some embodiments, after the step of forming the retardation layer 324, another retardation layer 324 may be coated on the retardation layer 324 that have been formed. Alternatively, in some embodiments, an intermediate layer 330 may be coated on the formed retardation layer 324 first, and then another retardation layer 324 may be coated on the intermediate layer 330, but not limited herein.

Figure 7:
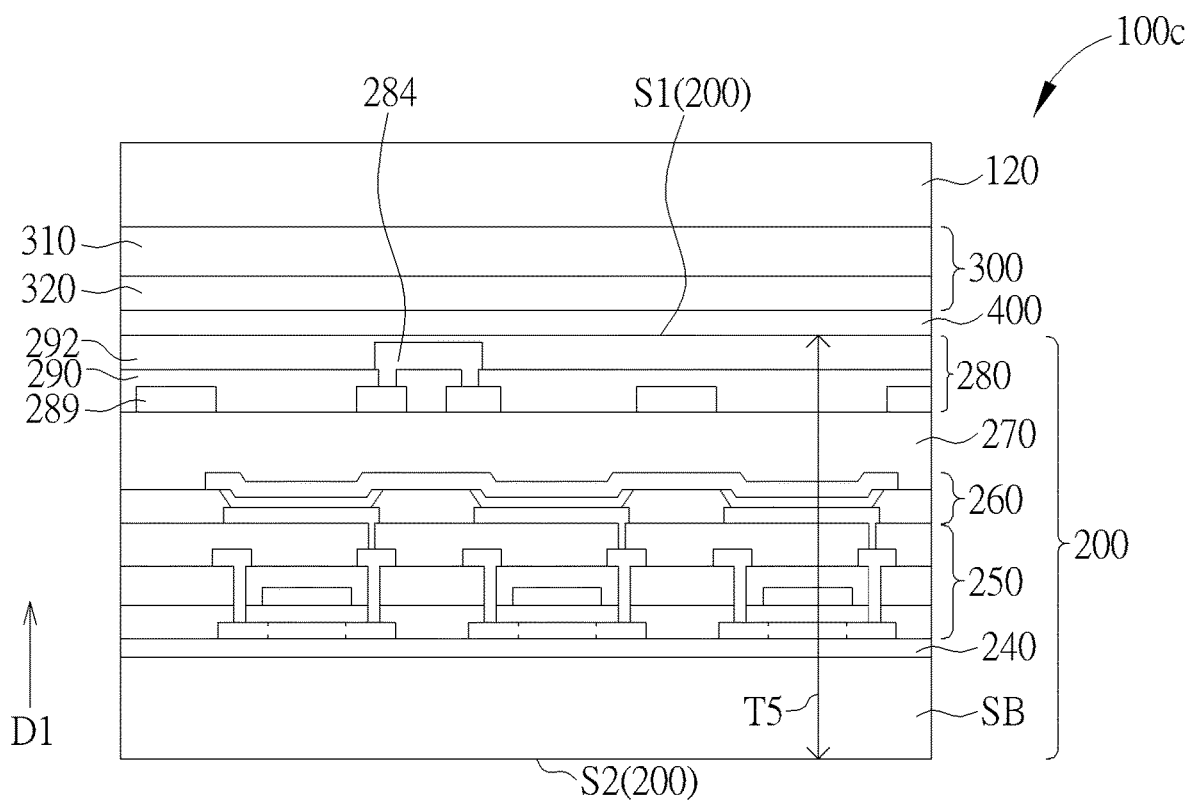
FIG. 7 is a partially enlarged cross-sectional view schematic diagram of a rollable display device according to a third embodiment of the present disclosure.

Please refer to FIG. 7. FIG. 7 is a partially enlarged cross-sectional view schematic diagram of a rollable display device according to a third embodiment of the present disclosure, which illustrates the detailed corresponding relationship of each layer of the rollable display device of the present disclosure. The rollable display device 100c shown in FIG. 7 may be applied to the rollable display device 100 shown in FIG. 1 to FIG. 3. As shown in FIG. 7, in some embodiments, the rollable display device 100c may include a substrate SB, an insulating layer 240 (e.g., a buffer layer), a circuit layer 250, a light emitting structure 260, an encapsulation layer 270, a touch layer 280, an adhesive 400, an optical layer and/or a cover layer 120 stacked sequentially along the first direction D1, and the manufacturing process of the rollable display device 110c may include the following steps. First, a substrate SB is provided. The substrate SB may include, for example, a substrate 210, a glue layer 220 and a substrate 230 as shown in FIG. 4 or FIG. 5, and a supporting structure 110 as shown in FIG. 4 or FIG. 5 may be disposed under the substrate SB, but not limited herein. In some embodiments, the touch layer 280 may include a plurality of conductive layers, and the touch layer 280 may include, for example, a conductive layer 289, an insulating layer 290, a conductive layer 284 and/or an insulating layer 292 in sequence. The conductive layer 284 may be, for example, filled in the openings of the insulating layer 290 to be electrically connected to the conductive layer 289, and the insulating layer 292 may, for example, cover the conductive layer 284 and/or the conductive layer 289, but not limited herein. In some embodiments, the conductive layer 289 and the conductive layer 284 may include metal materials or transparent conductive materials. For example, the conductive layer 289 and the conductive layer 284 may construct a metal mesh structure to form the touch electrodes of the touch layer 280, but not limited herein. The rollable display device 100c shown in FIG. 7 is, for example, a multi-layer touch rollable display device 100c.

Figure 8:
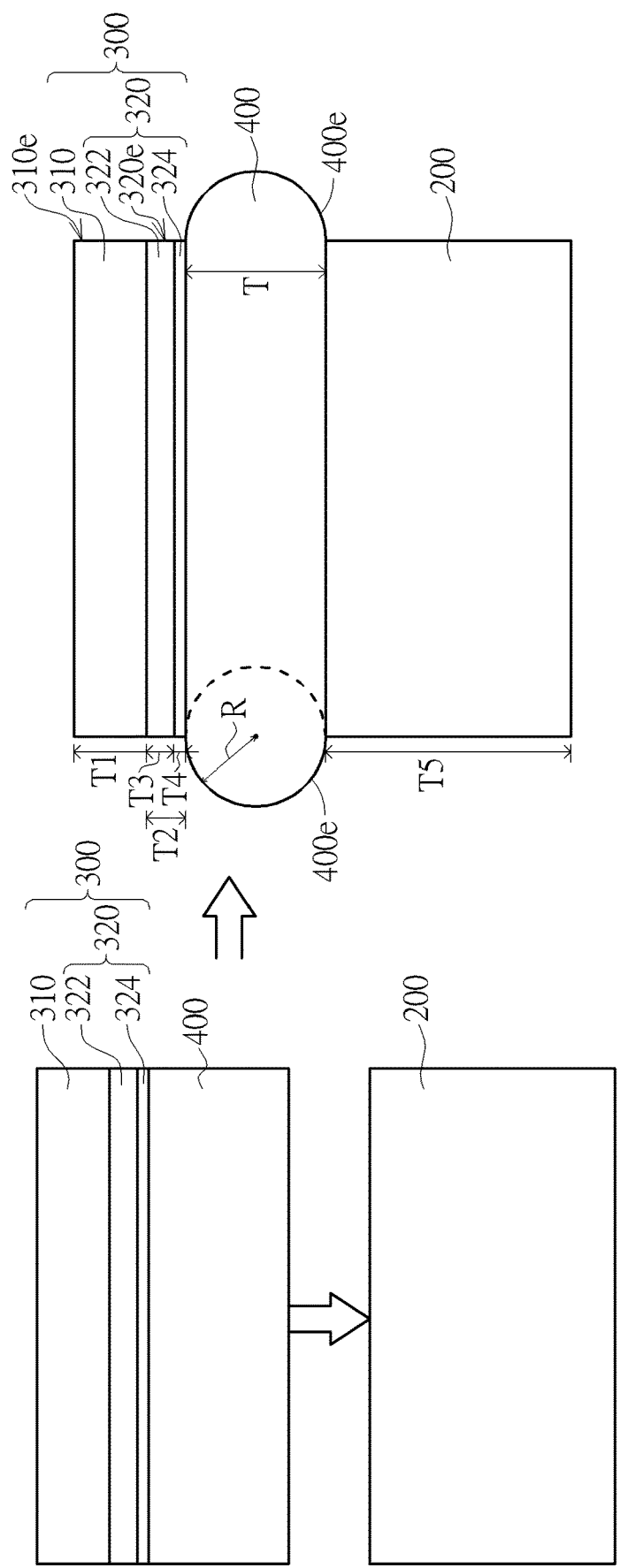
FIG. 8 is a manufacturing process schematic diagram of attaching an optical layer to a display layer through an adhesive in a rollable display device according to an embodiment of the present disclosure.

Please refer to FIG. 8. FIG. 8 is a manufacturing process schematic diagram of attaching an optical layer to a display layer through an adhesive in a rollable display device according to an embodiment of the present disclosure. As shown in FIG. 8, the attaching process of the optical layer 300 and the display layer 200 may include the following steps. First, an optical layer 300 is provided. The optical layer 300 may include a base layer 310 and a functional layer 320. The functional layer 320 may include a polarizing layer 322 and/or a retardation layer 324. The manufacturing steps of the optical layer 300 may be referred to the previous embodiments, which will not be described redundantly herein. Then, an adhesive 400 is coated on the optical layer 300. For example, the adhesive 400 is coated on the surface of the retardation layer 324 of the optical layer 300. Then, the structure of the optical layer 300 and the adhesive 400 is reversed, so that the adhesive 400 faces the display layer 200, that is, the functional layer 320 is closer to the display layer 200 than the base layer 310. Then, the optical layer 300 is attached to the display layer 200 through the adhesive 400 by applying pressure over the base layer 310. In some embodiments, the adhesive 400 may be coated on the display layer 200 first, then the functional layer 320 of the optical layer 300 faces the adhesive 400, and then the optical layer 300 is attached to the display layer 200 through the adhesive 400 by applying pressure over the base layer 310. The lower side of the display layer 200 may have the substrate mentioned in the previous embodiments or a temporary carrier, which is omitted in FIG. 8. From the above description, the processes of the layers (e.g., the polarizing layer 322 and/or the retardation layer 324) in the optical layer 300 of the present disclosure may be completed by the coating processes. Compared with the traditional optical layer including multiple base layers, the optical layer 300 of the present disclosure may, for example, include just one base layer 310. This design of the structure may reduce the thickness of the optical layer 300, reduce the stress generated by the rollable display device during the rolled-up process, and reduce the risk of damage to the display layer 200. In addition, in the attaching process of the optical layer 300 and the display layer 200, for example, applying pressure over the base layer 310 may reduce the probability that the functional layer 320 is scratched or damaged. Furthermore, the adhesive 400 in contact with the functional layer 320 may also protect the functional layer 320 from scratching or damage.

As shown in the right side of FIG. 8, after the optical layer 300 is attached to the display layer 200 through the adhesive 400 by applying pressure over the base layer 310, at least one edge 400e of the adhesive 400 is more protruded with respect to an corresponding edge 320e of the functional layer 320 (or an corresponding edge 310e of the base layer 310). For example, the edge 400e of the adhesive 400 may be curved or other irregular shapes, so that the edge 400e of the adhesive 400 is protruded from the corresponding edge 320e of the functional layer 320 (or the corresponding edge 310e of the base layer 310), but not limited herein. According to the degree or radian of protruding of the edge 400e of the adhesive 400, it may be judged whether the degree of attaching is within the standard range, such as that whether the pressure applied over the base layer 310 is sufficient. For example, the adhesive 400 may have a thickness T, and the curved shape of the edge 400e of the adhesive 400 has a radius of curvature R. The radius of curvature R may be, for example, greater than or equal to 0.4 times of the thickness T and less than or equal to 0.6 times of the thickness T, that is, $0.4*T \leq R \leq 0.6*T$, which makes it difficult to be peeled off between the optical layer 300 and the display layer 200, but not limited herein. The measurement method of the thickness T of the adhesive 400 will be further described in the following related contents of FIG. 10.

Figure 9:
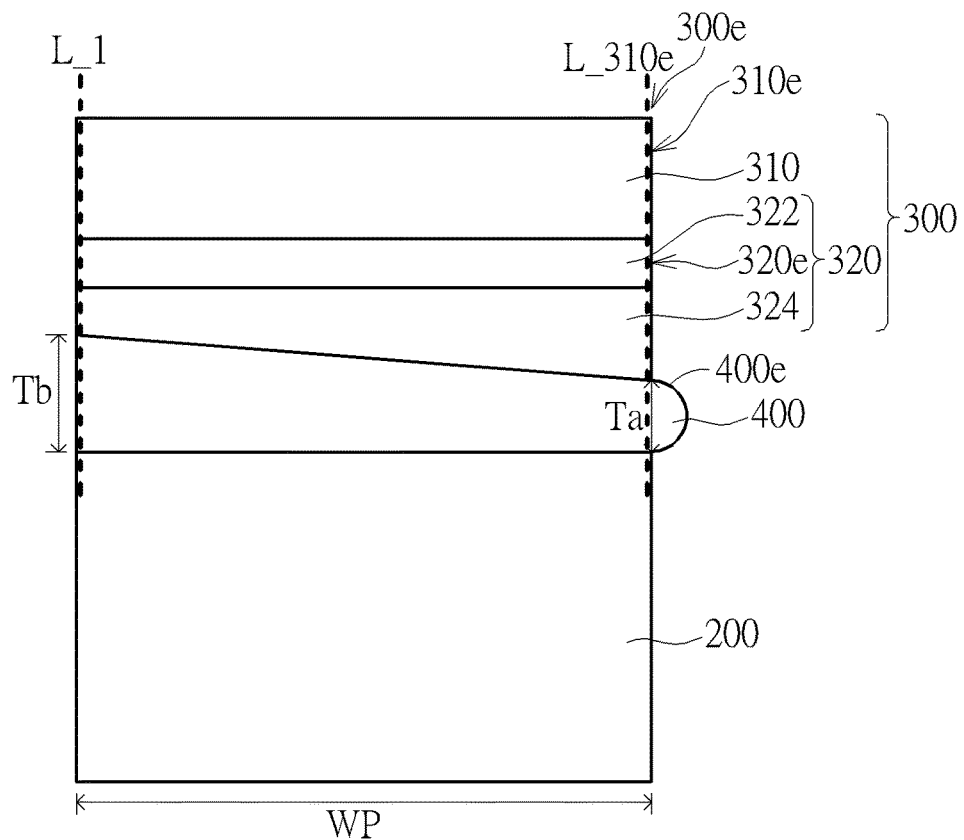
FIG. 9 is an enlarged schematic diagram of a partial cross-sectional view of a display layer, an adhesive and an optical layer of a rollable display device according to an embodiment of the present disclosure.

Please refer to FIG. 9. FIG. 9 is an enlarged schematic diagram of a partial cross-sectional view of a display layer, an adhesive and an optical layer of a rollable display device according to an embodiment of the present disclosure, and the acquired portion shown therein is adjacent to the edge of the optical layer, and a width WP of the acquired portion is, for example, 200 micrometers. That is to say, the schematic diagram of the partial cross-sectional view of the portion of the optical layer acquires a portion of the optical layer 300 from the edge 300e of the optical layer 300 inward 200 micrometers. As shown in FIG. 9, when the attaching process of the optical layer 300 and the display layer 200 is performed, the closer to the edge portion of the optical layer 300 (e.g., the edge 310e of the base layer 310), the stronger pressure is applied to the adhesive 400. That is to say, the pressure applied over the base layer 310 increases, for example, toward the edge 310e of the base layer 310. Therefore, a thickness Ta of the adhesive 400 corresponding to the edge 310e of the base layer 310 may be, for example, less than the thickness Tb of the adhesive 400 away from the edge 310e of the base layer 310 (i.e., Ta≤Tb), so the edge portion of the optical layer 300 is less easily to peel off when stretched during the rolled-up process. An extension line L_310e may be substantially obtained at the edge 310e of the base layer 310, and the thickness Ta may be defined as the thickness of the adhesive 400 on the extension line L_310e. In addition, an extension line L_1 may be obtained at the position about 200 micrometers distanced from the edge 310e of the base layer 310, and the thickness Tb may be defined as the thickness of the adhesive 400 on the extension line L_1. In some embodiments, the ratio of the thickness Ta of the adhesive 400 to the thickness Tb of the adhesive 400 is greater than or equal to 0.5 and less than 1 (i.e., 0.5≤Ta/Tb≤1), but not limited herein. Therefore, the thickness Ta of the adhesive 400 corresponding to the edge 310e of the base layer 310 may not be relatively too thin to cause insufficient adhesion, or the thickness Tb of the adhesive 400 may not be too thick to peel off easily. The lower side of the display layer 200 of the present disclosure may have the substrate mentioned in the previous embodiments or a temporary carrier, which is omitted in FIG. 9.

In some embodiments, the thickness of each layer of the optical layer 300 of the rollable display device in the present disclosure has a specific proportional relationship. In detail, as shown in FIG. 8, the thickness T1 of the base layer 310 is, for example, less than the thickness T of the adhesive 400, or the thickness T2 of the functional layer 320 is, for example, less than the thickness T1 of the base layer 310 (i.e., T1<T or T2<T1). The sum of the thickness T1 of the base layer 310 and the thickness T2 of the functional layer 320 is, for example, less than the thickness T of the adhesive 400 (i.e., (T2+T1)<T). The ratio of the thickness T2 of the functional layer 320 to the thickness T1 of the base layer 310 may range from 0.1 to 0.8 (i.e., 0.1≤T2/T1≤0.8), but not limited herein. This ratio may range from 0.15 to 0.55 (i.e., 0.15≤T2/T1≤0.55) in some embodiments. The thickness of each layer of the optical layer 300 has a specific proportional relationship through the above design, so that during the attaching process of the optical layer 300, the probability of damage or functional failure caused by stress inside the functional layer 320 or the probability of peeling off from each other between each layer in the optical layer 300 due to stress may be reduce, thereby improving the function and performance of each layer and improving the quality of the rollable display device.

In addition, in the functional layer 320, the thickness T3 of the polarizing layer 322 may be greater than the thickness T4 of the retardation layer 324 (i.e., T3>T4). Since both the polarizing layer 322 and the retardation layer 324 are formed by coating processes, for example, their thicknesses are substantially consistent or uniform in each area, but not limited herein. When the retardation layer 324 may include a plurality of sub-layers (not shown), intermediate layers (not shown) may be selectively disposed between these sub-layers. For example, when the retardation layer 324 may include a first sub-layer (e.g., a quarter-wave retardation layer) and a second sub-layer (e.g., a half-wave retardation layer), the overall thickness of the retardation layer 324 may be obtained by, for example, measuring the thicknesses of the respective sub-layers among the retardation layer 324 and summing up the thicknesses of these sub-layers. That is to say, the thicknesses of the intermediate layers between the different sub-layers of the retardation layer 324 may be omitted when measuring the thickness of the retardation layer 324. When the polarizing layer 322 may include a plurality of sub-layers (not shown), intermediate layers (not shown) may be selectively disposed between these sub-layers. Similarly, the overall thickness of the polarizing layer 322 may be obtained by measuring the thicknesses of the respective sub-layers among the polarizing layer 322 and summing up the thicknesses of these sub-layers. That is to say, the thicknesses of the intermediate layers between the different sub-layers of the polarizing layer 322 may be omitted when measuring the thickness of the polarizing layer 322.

In some embodiments, the optical layer 300 and the display layer 200 of the rollable display device in the present disclosure have a specific proportional relationship. In detail, as shown in FIG. 8, the thickness of the optical layer 300 (approximately equal to the sum of the thickness T1 of the base layer 310 and the thickness T2 of the functional layer 320) is less than the thickness T5 of the display layer 200 (i.e., (T1+T2)<T5). In some embodiments, the thickness of the optical layer 300 may range from 10 micrometers to 50 micrometers (i.e., 10 μm≤thickness of the optical layer 300 ≤50 μm) or from 20 micrometers to 40 micrometers (i.e., 20 μm≤thickness of the optical layer 300 ≤40 μm). For example, the thickness of the optical layer 300 may be 20 μm, 30 μm or 45 μm, but not limited herein. In some embodiments, the thickness T5 of the display layer 200 may range from 45 micrometers to 300 micrometers (i.e., 45 μm≤thickness T5≤300 μm) or 80 micrometers to 200 micrometers (i.e., 80 μm≤thickness T5≤200 μm). For example, the thickness T5 of the display layer 200 may be 60 μm, 75 μm, 110 μm or 150 μm, but not limited herein. In some embodiments, the ratio of the thickness of the optical layer 300 (i.e., T1+T2) to the thickness T5 of the display layer 200 may range from 0.3 to 0.6 (i.e., 0.3≤(T1+T2)/T5≤0.6). The optical layer 300 and the display layer 200 have a specific proportional relationship through the above design, so that during the process of repeated expanding and/or folding, the stress that the display layer 200 bears may be reduced, and the problems of damage or peeling off of the circuits or layers in the display layer 200 may be reduced. It should be noted that, as the rollable display device 100a shown in FIG. 4, the thickness T5 of the display layer 200 may be measured from the back side S2 of the display layer 200 (e.g., the bottom surface of the substrate 210) to the front side S1 of the display layer 200 (e.g., the surface of the insulating layer 290 away from the substrate 210). As the rollable display device 100b shown in FIG. 5, the thickness T5 of the display layer 200 may be measured from the back side S2 of the display layer 200 (e.g., the bottom surface of the substrate 210) to the front side S1 of the display layer 200 (e.g., the surface of the encapsulation layer 270 away from the substrate 210). As the rollable display device 100c shown in FIG. 7, the thickness T5 of the display layer 200 may be measured from the back side S2 of the display layer 200 (e.g., the bottom surface of the substrate SB) to the front side S1 of the display layer 200 (e.g., the surface of the insulating layer 292 of the touch layer 280 away from the substrate SB). It should be noted that, the front side S1 of the display layer 200 may be, for example, in contact with the adhesive 400.

Figure 10:
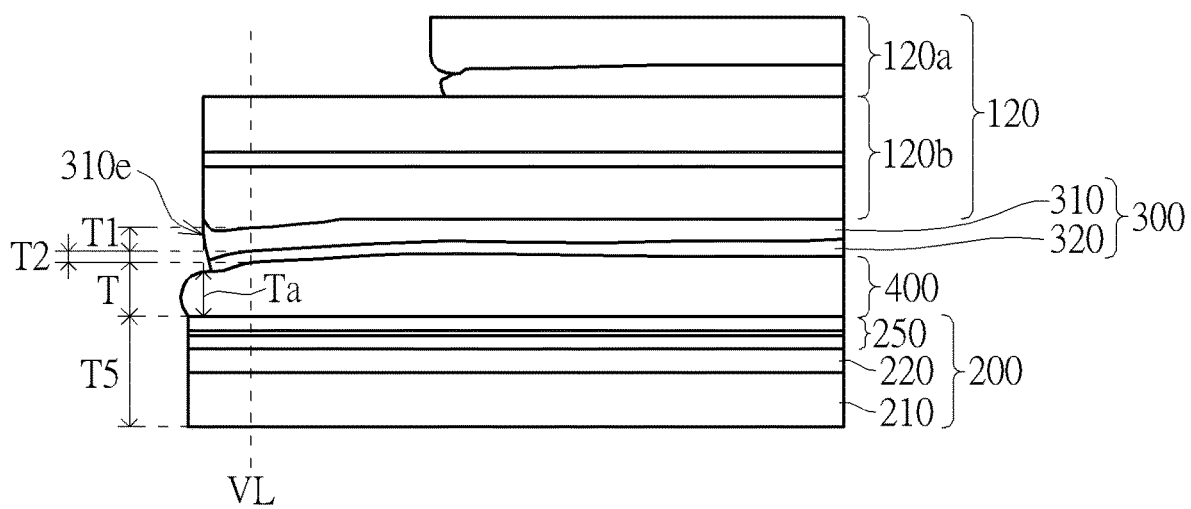
FIG. 10 is a depiction schematic diagram of a partial cross-sectional view of a rollable display device according to an embodiment of the present disclosure.

Please refer to FIG. 10. FIG. 10 is a depiction schematic diagram of a partial cross-sectional view of a rollable display device according to an embodiment of the present disclosure. As shown in FIG. 10, the rollable display device may include a display layer 200, an adhesive 400, an optical layer 300 and/or a cover layer 120. The display layer 200 may include a substrate 210, a glue layer 220 and/or a circuit layer 250. The optical layer 300 may include a base layer 310 and a functional layer 320 (which may be a composite layer). The cover layer 120 may include a first cover layer 120a and/or a second cover layer 120b. The thickness T5 of the display layer 200, the thickness T of the adhesive 400, the thickness T2 of the functional layer 320 and the thickness T1 of the base layer 310 may be measured in the following methods: Obtain an area at least 200 micrometers inward from the edge portion of the optical layer 300 (or such as the edge 310e of the base layer 310) in the cross-sectional view of the rollable display device (such as using an image of scanning electron microscope, but not limited herein). In this area, obtain any vertical line VL that can pass through each layer at the same time, and the thickness of each layer may be defined as the thickness of each layer measured along this vertical line VL. In addition, as shown in FIG. 10, the thickness Ta of the adhesive 400 corresponding to the edge 310e of the base layer 310 is measured as described above. Obtain an extension line L_310e (not shown in FIG. 10, referred to FIG. 9 for the extension line L_310e) from the edge 310e of the base layer 310, and the thickness of the adhesive 400 corresponding to this extension line L_310e is defined as the thickness Ta, but not limited herein.

From the above description, according to the rollable display device of the embodiments in the present disclosure, through the design of structure of the optical layer and attaching the optical layer to the display layer through the adhesive, the influence of the stress generated during the process of repeated expanding and/or folding on the layers in the structure may be reduced, or the distribution of the stress in the structure may be adjusted accordingly, so that the risk of device damage may be reduced, and the function and performance of each layer in the rollable display device may be improved, thereby improving the quality of the rollable display device and the quality of displaying pictures.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A rollable display device having a normal display status and an expanded display status, comprising:
    a display layer having a greater display area when the rollable display device being in the expanded display status than in the normal display status; and
    an optical layer attached to the display layer through an adhesive, the optical layer comprising a base layer and a functional layer disposed between the base layer and the adhesive, wherein the functional layer is in contact with the adhesive,
    wherein an edge of the adhesive is a curved shape having a radius of curvature, and the radius of curvature is greater than or equal to 0.4 times of a thickness of the adhesive and less than or equal to 0.6 times of the thickness of the adhesive.

2. The rollable display device according to claim 1, wherein the functional layer is formed on the base layer through multiple coating processes.

3. The rollable display device according to claim 1, wherein the functional layer comprises a polarizing layer and a retardation layer.

4. The rollable display device according to claim 3, wherein a thickness of the polarizing layer is greater than a thickness of the retardation layer.

5. The rollable display device according to claim 3, wherein the polarizing layer comprises iodine.

6. The rollable display device according to claim 1, wherein a thickness of the functional layer is less than a thickness of the base layer.

7. The rollable display device according to claim 6, wherein a ratio of the thickness of the functional layer to the thickness of the base layer ranges from 0.1 to 0.8.

8. The rollable display device according to claim 1, wherein a thickness of the base layer is less than the thickness of the adhesive.

9. The rollable display device according to claim 1, wherein a thickness of the optical layer is less than a thickness of the display layer.

10. The rollable display device according to claim 1, wherein a thickness of a portion of the adhesive corresponding to an edge of the base layer is less than a thickness of another portion of the adhesive away from the edge of the base layer.

11. The rollable display device according to claim 1, further comprising a cover layer disposed on the optical layer, wherein the edge of the adhesive is more protruded with respect to an edge of the cover layer.

* * * * *